US012718879B2

(12) United States Patent
Ross

(10) Patent No.: US 12,718,879 B2
(45) Date of Patent: Aug. 25, 2026

(54) RADIATION HARDENED E-FUSE MACRO

(71) Applicant: BAE Systems Information and Electronic Systems Integration Inc., Nashua, NH (US)

(72) Inventor: Jason F. Ross, Haymarket, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 168 days.

(21) Appl. No.: 18/800,530

(22) Filed: Aug. 12, 2024

(65) Prior Publication Data

US 2024/0404591 A1 Dec. 5, 2024

Related U.S. Application Data

(62) Division of application No. 17/552,844, filed on Dec. 16, 2021, now Pat. No. 12,080,344.

(51) Int. Cl.
*G11C 11/56* (2006.01)
*G11C 17/16* (2006.01)
*G11C 17/18* (2006.01)

(52) U.S. Cl.
CPC .......... *G11C 11/5692* (2013.01); *G11C 17/16* (2013.01); *G11C 17/18* (2013.01)

(58) Field of Classification Search
CPC ...... G11C 11/5692; G11C 17/16; G11C 17/18
See application file for complete search history.

(56) References Cited

U.S. PATENT DOCUMENTS

| | | | | |
|---|---|---|---|---|
| 5,657,280 | A * | 8/1997 | Shin | G11C 29/785 365/225.7 |
| 6,292,422 | B1 * | 9/2001 | Pitts | G11C 17/18 365/96 |
| 6,430,101 | B1 | 8/2002 | Toda | |
| 2005/0270841 | A1 | 12/2005 | Merritt | |
| 2008/0002451 | A1 | 1/2008 | Anand et al. | |
| 2008/0094896 | A1 | 4/2008 | Erickson et al. | |
| 2010/0038748 | A1 * | 2/2010 | Yamaguchi | G11C 17/16 257/E29.325 |
| 2011/0002186 | A1 | 1/2011 | Buonpane | |
| 2012/0146664 | A1 | 6/2012 | Huang et al. | |
| 2014/0369137 | A1 | 12/2014 | Lee et al. | |
| 2017/0178742 | A1 * | 6/2017 | Qiu | G11C 17/18 |
| 2020/0265905 | A1 * | 8/2020 | Mori | G11C 17/18 |

OTHER PUBLICATIONS

International Search Report, PCT/US22/52823, mailed Apr. 13, 2023, 10 pages.

* cited by examiner

*Primary Examiner* — Uyen Smet
(74) *Attorney, Agent, or Firm* — Scott J. Asmus; Maine Cernota & Curran

(57) ABSTRACT

A multi-bit, asynchronous e-fuse macro, the macro comprising: an input output enable, a power on reset, a write address, an input write enable, a ground clamp enable, and a write clock; a plurality of e-fuse bits; a supply voltage configured to allow programming at least one of the e-fuse bits; at least one fuse output; and self-timing and control circuitry configured to perform signaling, wherein each of the inputs is in electrical communication with the e-fuse macro.

14 Claims, 11 Drawing Sheets

800

900

1100

RADIATION HARDENED E-FUSE MACRO

CROSS-REFERENCE TO RELATED APPLICATIONS

This patent application is a divisional of U.S. patent application Ser. No. 17/552,844, filed Dec. 16, 2021, which is incorporated by reference herein

FIELD OF THE DISCLOSURE

The following disclosure relates generally to fuses and, more specifically, to radiation hardened electronic fuses (E-FUSE).

BACKGROUND

As a preliminary matter, an electronic fuse, or e-fuse, while sometimes acting as an active circuit protection device with an integrated Field Effect Transistor (FET) that is used to limit currents and voltages to safe levels during fault conditions, can also be used as a non-volatile, programmable memory element. Such an e-fuse can be inexpensively incorporated into an Integrated Circuit (IC), such as a Very Large Scale Integration (VLSI) IC, relative to charge storage based non-volatile memory, such as Flash.

These fuses function as resistive links that can be permanently programmed in either a conductive or highly resistive state, which is typically sensed at device power on and latched in memory. Notably, this allows for reconfiguration of chip function, such as disabling or enabling portions thereof to achieve design goals or work around issues, such as manufacturing defects, affecting portions of the chip in the field.

Static Random-Access Memory (static RAM or SRAM) is a type of random-access memory (RAM) that uses latching circuitry (e.g. flip-flops) to store each bit. SRAM is volatile memory, meaning data is lost when power is removed. The term static differentiates SRAM from DRAM (Dynamic Random-Access Memory), which must be periodically refreshed.

Electronic fuses are now finding use in SRAM circuits, which operate asynchronously and do not inherently require an external clock. Synchronous operation and an external clock are, however, required by current e-fuse implementations, requiring such circuits to be redesigned to support asynchronous operation when incorporating e-fuse technology.

Furthermore, an e-fuse that supports asynchronous operation and operation without an external clock that could also be used in high radiation environments would be beneficial in expanding the potential usage of such an e-fuse to environments where resistance to such conditions is needed.

What is needed, therefore, is an electronic fuse that can operate asynchronously and be integrated into radiation hardened products that do not require a clock while minimizing the addition of additional circuitry and components.

SUMMARY

Embodiments of the present disclosure provide radiation hardened e-fuse technology appropriate for integration into asynchronous memory designs for memory repair, which was previously accomplished using laser programmable metal fuses.

In embodiments, asynchronous read/write circuitry is controlled by a combination of shared functional I/O signals and test signals.

Further embodiments provide a fuse sensing capability that only requires a power on reset signal and that is internally self-timed.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

As a preliminary matter, Verilog notation, such as [X:x] is used herein and in the figures. Where present, this should be understood to refer to a bus containing multiple bits, numbered from X down to x. For example, [2:0] would indicate a three bit bus (i.e. 2, 1, 0).

Figure 1:
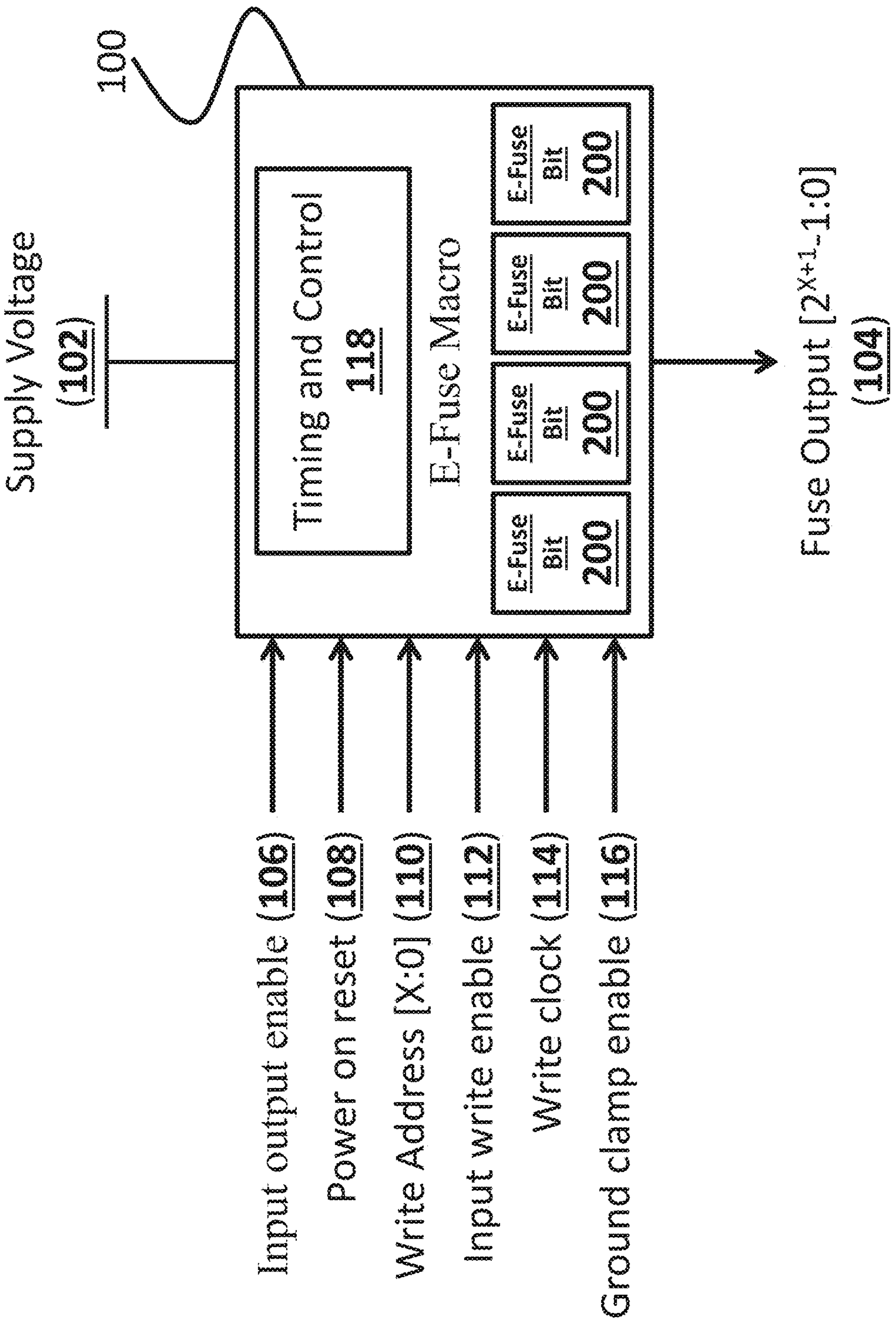
FIG. 1 is a schematic describing a multi-bit, asynchronous e-fuse macro, in accordance with embodiments of the present disclosure.

Now regarding FIG. 1, a schematic describing a multi-bit, asynchronous e-fuse macro 100, in accordance with embodiments of the present disclosure is depicted. In embodiments, the e-fuse macro contains a plurality of e-fuse bits 200, which may also be referred to as e-fuse circuits 200, and which are depicted individually and in greater detail in FIG. 2.

Now referring again to FIG. 1, the e-fuse macro 100 of embodiments comprises the following inputs: an input output enable 106 (active high in embodiments), a power on reset 108 (active low in embodiments), a write address 110, an input write enable 112 (active high in embodiments), a write clock 114 (active high in embodiments), and a ground clamp enable 116 (active low in embodiments). A supply voltage 102 (i.e. $V_{PROGRAM}$) input is also included, in embodiments, for programming purposes. Finally, the e-fuse macro 100 comprises a fuse output ($[2^{X+1}-1:0]$) 104.

In embodiments, the write address 110 is a variable width bus (e.g. [X:0]). The value of the most significant bit of the write address 110 bus, X, in embodiments, is selected based on the desired number of fuse output ($[2^{X+1}-1:0]$) 104 bits, where the number of fuse output ($[2^{X+1}-1:0]$) 104 bits is equal to two raised to the power of X+1.

In embodiments, the e-fuse macro 100 supports two operating modes, an application mode, which is used to read the e-fuse macro 100, and a programming mode, which is used to write the e-fuse macro 100.

In embodiments, the e-fuse macro 100 is configured such that only one e-fuse 200 can be written at a time. Write operations are further described in FIG. 6, FIG. 7, FIG. 9, and FIG. 11.

In embodiments, the e-fuse macro 100 is configured such that all e-fuses 200 are read simultaneously. Read operations are further described in FIG. 4, FIG. 5, FIG. 8, and FIG. 10.

In embodiments, all e-fuse macro 100 functions are externally controlled.

In embodiments, any signaling required to read the state of each e-fuse memory element 228 is generated via self-timing and control circuitry 118 included within the e-fuse macro 100. The inclusion of the self-timing and control circuitry 118 enables the multi-bit, asynchronous e-fuse macro 100 to operate in asynchronous designs as no periodic clock signal is required to perform read operations.

Figure 2:
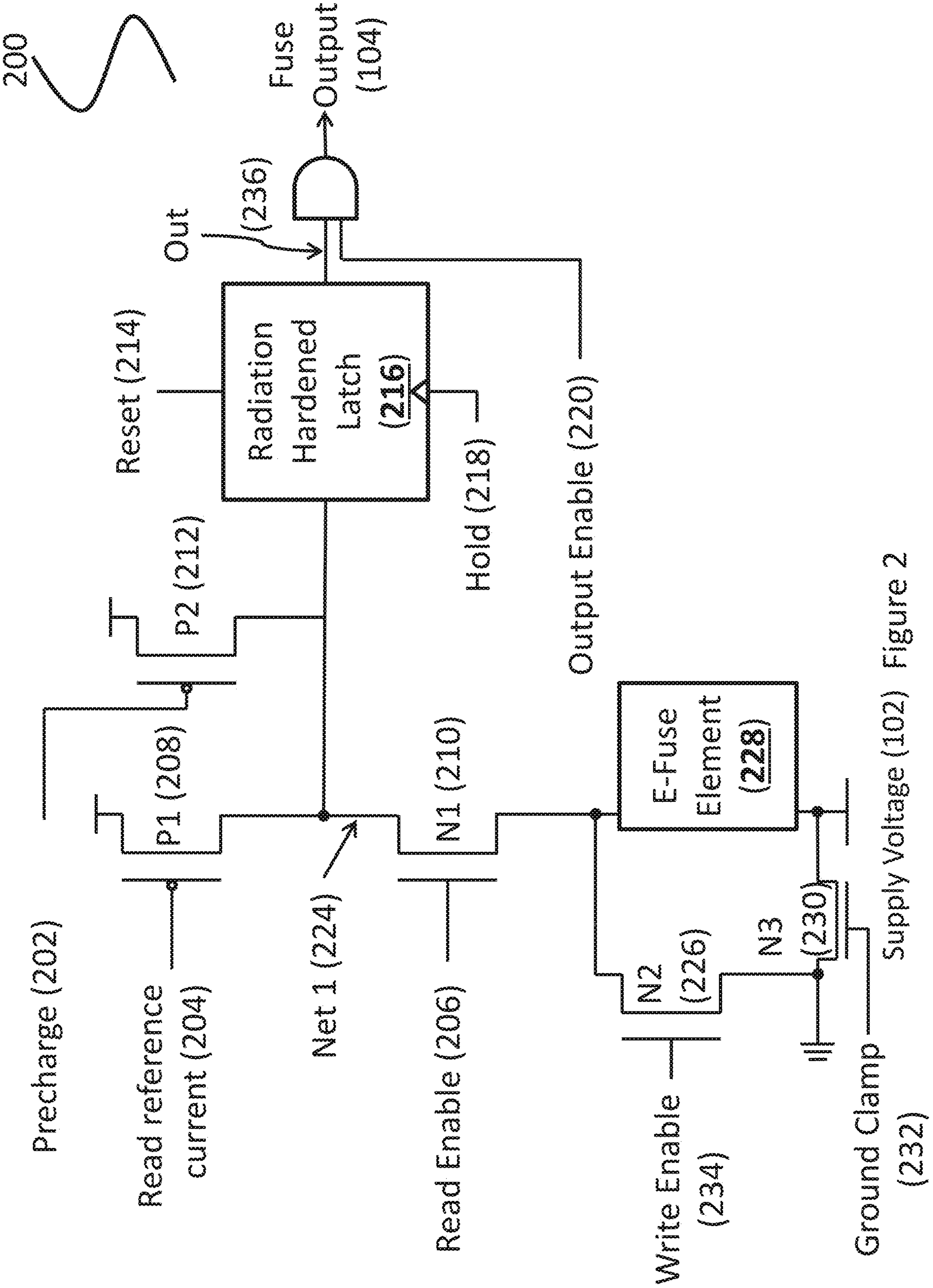
FIG. 2 is a schematic describing a single e-fuse bit, in accordance with embodiments of the present disclosure.

Now regarding FIG. 2, a schematic describing a single e-fuse bit 200, in accordance with embodiments of the present disclosure, is depicted. More specifically, the e-fuse bit 200 of such embodiments comprises the following inputs: a reset 214, a read reference current 204, a precharge 202 (active low in embodiments), a read enable 206, a hold (also referred to herein as a latch clock) 218, an output enable 220, a ground clamp 232, and a write enable 234. A voltage supply input 102, the same as described in FIG. 1, is also included for programming purposes. Finally, the e-fuse circuit 200 comprises a fuse output 104.

Again referring to FIG. 2, the e-fuse circuit 200 of embodiments comprises the following components: a first p-channel MOSFET (P1) 208, a second p-channel MOSFET (P2) 212, a first n-channel MOSFET (N1) 210, a second n-channel MOSFET (N2) 226, a third n-channel MOSFET (N3) 230, an e-fuse memory element 228, a radiation hardened latch circuit 216, and a logical AND gate 236. The functionality of each component within the e-fuse circuit 200 is further described in FIG. 5, FIG. 7, FIG. 10, and FIG. 11.

Figure 3:
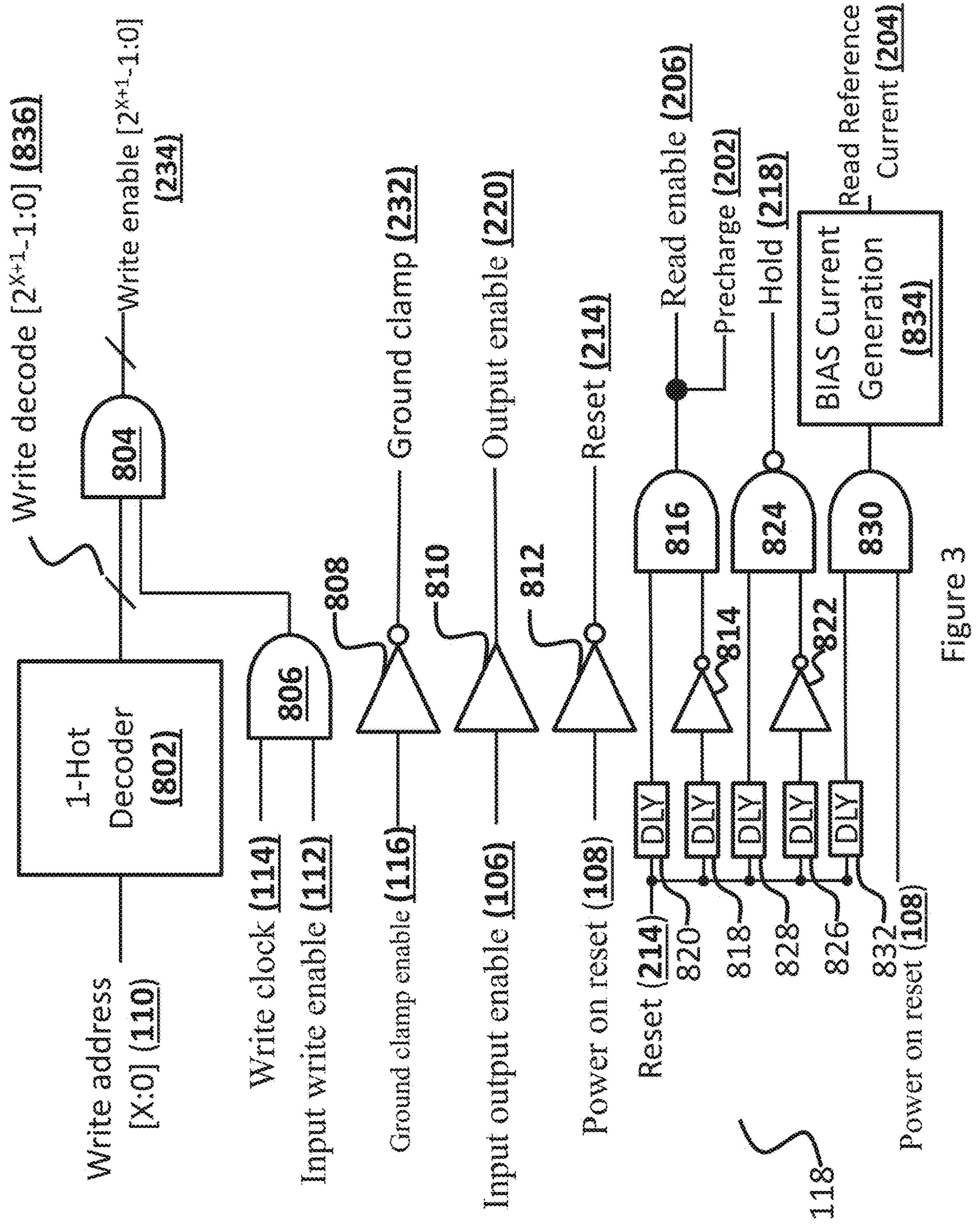
FIG. 3 is a schematic describing self-timing and control circuitry, in accordance with embodiments of the present disclosure.

Now referring to FIG. 3, the self-timing and control circuitry 118 included within the c-fuse macro 100 of embodiments is depicted in greater detail. More specifically, in FIG. 3 the logical inverter 814, logical AND gate 816, and delay circuits 818/820, in embodiments, form a positive (active high) pulse generation circuit, which is activated by the rising edge of input power on reset 108 (active low in embodiments); delay circuit 818 determines the rising edge delay of the pulse generated on outputs read enable 206 (active high in embodiments) and precharge 202 (active low in embodiments). Furthermore, the time difference between delay circuit 818 and delay circuit 820 determines the pulse width of the pulse generated on outputs read enable 206 (active high in embodiments) and precharge 202 (active low in embodiments).

Also, in such embodiments, logical inverter 822, logical NAND gate 824, and delay circuits 826/828 form a negative (active low) pulse generation circuit activated by the rising edge of input power on reset 108 (active low in embodiments); delay circuit 826 determines the falling edge delay of the pulse generated on output hold 218. Furthermore, the time difference between delay circuit 826 and delay circuit 828 determines the pulse width of the pulse generated on output hold 218.

Again regarding FIG. 3, logical AND gate 830 and delay circuit 832 form a positive (active high) pulse generation circuit activated by the rising edge of input power on reset 108 (active low in embodiments). Delay circuit 832 determines the pulse width of the enable signal used by the bias generation circuit 834, which creates the read reference current 204 used by the e-fuse circuit 200. Finally, logical inverter 812 converts the power on reset 108 input (active low in embodiments) to the reset 214 (active high in embodiments) input used by the e-fuse circuit 200.

Lastly regarding FIG. 3, decoder 802 (also referred to herein as a 1-Hot Decoder) converts the write address 110 input bus into a 1-hot write decode $[2^{X+1}-1:0]$ bus 836. A plurality of logical AND gates 804 provide additional gating of the 1-hot write decode $[2^{X+1}-1:0]$ bus 836 to allow the write clock 114 input (active high in embodiments) to control the pulse width of output write enable $[2^{X+1}-1:0]$ 234 (active high in embodiments). Logical AND gate 806 provides clock gating control of the write clock 114 input (active high in embodiments) via the input write enable 112 input (active high in embodiments). Logical inverter 808 converts the ground clamp enable 116 input (active low in embodiments) to the ground clamp 232 (active high in embodiments) input used by the e-fuse circuit 200. Finally, logical buffer 810 redrives input output enable 106 (active high in embodiments) to output enable 220 (active high in embodiments).

Notably, while FIG. 3 describes one particular way of constructing such a circuit, other ways of constructing a circuit having similar functionality would be known to one of ordinary skill in the art; FIG. 3 is intended to be merely exemplary and non-limiting. For instance, designations of active high and active low should be considered merely exemplary. Similarly, designations of logic1 and logic0 should be considered merely exemplary and non-limiting.

In embodiments, a reset initialization sequence is used to place the e-fuse macro 100 of embodiments into application mode for reading each e-fuse memory element 228 and storing the state in a radiation hardened latch circuit 216 immediately following device power up. This procedure is graphically depicted in FIG. 4, from a top-level perspective, and in FIG. 5 from the perspective of a single e-fuse circuit 200. This is also described in a flowchart in FIG. 8 and FIG. 10.

Figure 4:
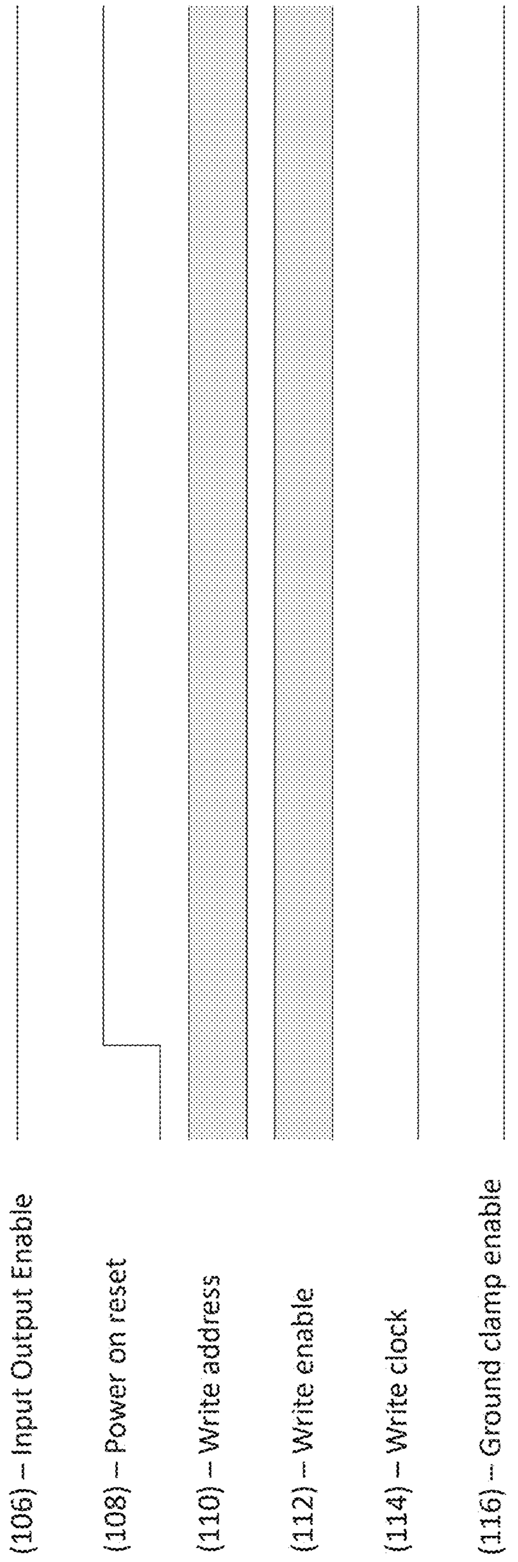
FIG. 4 is a timing diagram describing the signaling sequence for reading the multi-bit, asynchronous e-fuse macro, in accordance with embodiments of the present disclosure.

Now regarding FIG. 4, specifically, a timing diagram describing the signaling sequence for reading the multi-bit, asynchronous e-fuse macro 100, in accordance with embodiments of the present disclosure is depicted. Even more specifically, FIG. 4 illustrates the process for placing the multi-bit, asynchronous e-fuse macro 100 into an application (read) mode by either floating or grounding the supply voltage input 102, setting write clock 114 (active high in embodiments) to logic0, setting ground clamp enable 116 (active low in embodiments) to logic0, and setting input output enable 106 (active high in embodiments) to logic1. The write address 110 and input write enable 112 (active high in embodiments) inputs are not used and may be set to either logic0 or logic1.

Again referring to FIG. 4, the multi-bit, asynchronous e-fuse macro 100 is held in the reset state during device power up by holding power on reset 108 (active low in embodiments) at logic0. A read of all e-fuse circuits 200 is initiated when power on reset 108 (active low in embodiments) transitions from logic0 to logic1. In embodiments, the signaling required to read the state of each e-fuse memory element 228 is generated via self-timing and control circuitry 118 included within the e-fuse macro 100. The inclusion of the self-timing and control circuitry 118 enables the multi-bit, asynchronous e-fuse macro 100 to operate in asynchronous designs as no periodic clock signal is required to perform read operations.

Figure 5:
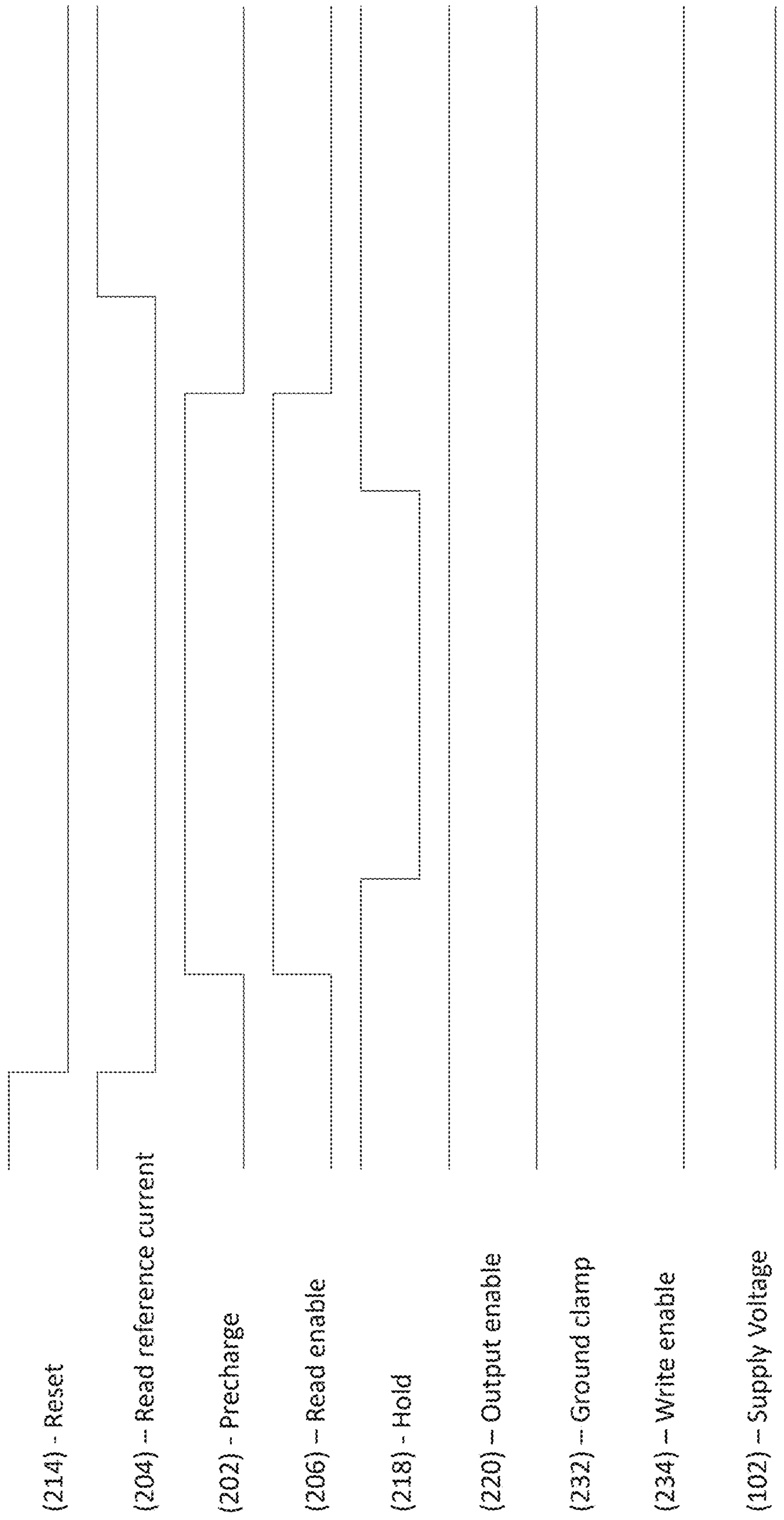
FIG. 5 is a timing diagram describing the signaling sequence for reading a single e-fuse bit, in accordance with embodiments of the present disclosure.

Now regarding FIG. 5, a timing diagram describing the signaling sequence for reading a single e-fuse bit 200, in accordance with embodiments of the present disclosure is depicted.

Now referring again to FIG. 5, the e-fuse circuit 200 is placed into application (read) mode by either floating or grounding the supply voltage input 102, setting output enable 220 (active high in embodiments) to logic1, setting ground clamp 232 (active high in embodiments) to logic1, and setting write enable 234 (active high in embodiments) to logic0. The previously described signal settings ensure that the circuitry used during write operations does not affect read operations.

Now referring to FIGS. 4 and 5, taken together, the e-fuse circuit 200 is held in the reset state during device power up by holding power on reset 108 (active low in embodiments) at logic0. In this state reset 214 (active high in embodiments) is set to logic1 thus resetting the radiation hardened latch 216, the read reference current 204 is set to logic1 turning off p-channel MOSFET 208, precharge 202 (active low in embodiments) is set to logic0 turning on second p-channel MOSFET (P2) 212 pulling up Net 1 224, read enable 206 (active high in embodiments) is set to logic0 turning off first n-channel MOSFET 210, and latch clock (hold) 218 is set to logic1, forcing the radiation hardened latch 216 into a hold state. A read of the e-fuse circuit 200 is initiated when power on reset 108 (active low in embodiments) transitions from logic0 to logic1. The logic0 to logic1 input transition of power on reset 108 (active low in embodiments) creates a sequence of self-timed control signals and results in the value of the e-fuse memory element 228 being stored in the radiation hardened latch 216.

The first event of the read sequence sets reset 214 (active high in embodiments) to logic0, de-asserting reset to the radiation hardened latch 216 and enables the read reference current 204 turning on first p-channel MOSFET (P1) 208.

The second event of the read sequence sets precharge 202 (active low in embodiments) to logic1 turning off second p-channel MOSFET (P2) 212 and sets read enable 206 (active high in embodiments) to logic1 turning on first n-channel MOSFET (N1) 210. During this step, the read reference current 204 is forced through the e-fuse memory element 228. The use of a current reference for read operations reduces read current variability and improves read endurance. If the c-fuse memory element 228 is un-programmed, the resistance is low and therefore the voltage at Net 1 224 is near ground and treated as logic0. If the e-fuse memory element 228 is programmed, the resistance is high and therefore the voltage at Net 1 224 is near the supply and treated as logic1.

The third event of the read sequence pulses the latch clock (hold) 218 to sample and then hold the logic value at Net 1 224, which represents the state of the e-fuse memory element 228, into the radiation hardened latch 216.

The fourth event of the read sequence sets precharge 202 (active low in embodiments) to logic0 turning on p-channel MOSFET 212 pulling up Net 1 224 and sets read enable 206 (active high in embodiments) to logic0, turning off first n-channel MOSFET 210.

The fifth and final event of the read sequence sets the read reference current 204 to logic1 turning off p-channel MOSFET 208. All signals except reset 214 (active high in embodiments) are returned to their initial state at the end of the read sequence. The reset 214 (active high in embodiments) signal is returned to its initial state when power on reset 108 (active low in embodiments) returns to logic0.

Figure 6:
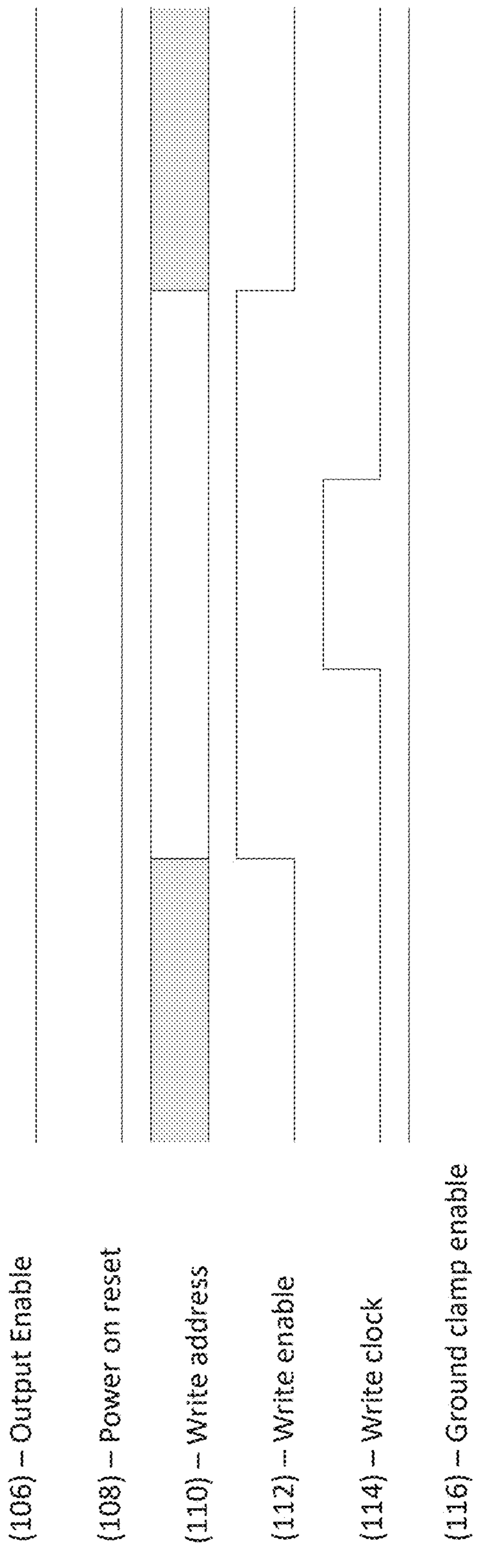
FIG. 6 is a timing diagram describing the signaling sequence for writing a multi-bit, asynchronous e-fuse macro, in accordance with embodiments of the present disclosure.

Now regarding FIG. 6, a timing diagram describing the signaling sequence for writing the multi-bit, asynchronous e-fuse macro 100, in accordance with embodiments of the present disclosure is depicted.

Now referring again to FIG. 6, the multi-bit, asynchronous e-fuse macro 100 is placed into programming (write) mode by initially grounding the supply voltage input 102, setting input output enable 106 (active high in embodiments) to logic0, setting power on reset 108 (active low in embodiments) to logic0, and setting ground clamp enable 116 (active low in embodiments) to logic1. The supply voltage input 102 is enabled once all inputs to the multi-bit, asynchronous c-fuse macro 100 are stable and valid.

Again referring to FIG. 6, a write operation to a single e-fuse bit 200 is preceded by setting the write address 110 to the targeted e-fuse bit 200 and setting input write enable 112 (active high in embodiments) to logic1. A pulse is then applied to the write clock 114 (active high in embodiments) to control programming of the e-fuse memory element 228. The write address 110 inputs ensure that only one e-fuse bit 200 is programmed at a time for the multi-bit, asynchronous e-fuse macro 100. The input write enable 112 input (active high in embodiments) is included to extend decoding for designs that use multiple multi-bit, asynchronous e-fuse macros 100.

Figure 7:
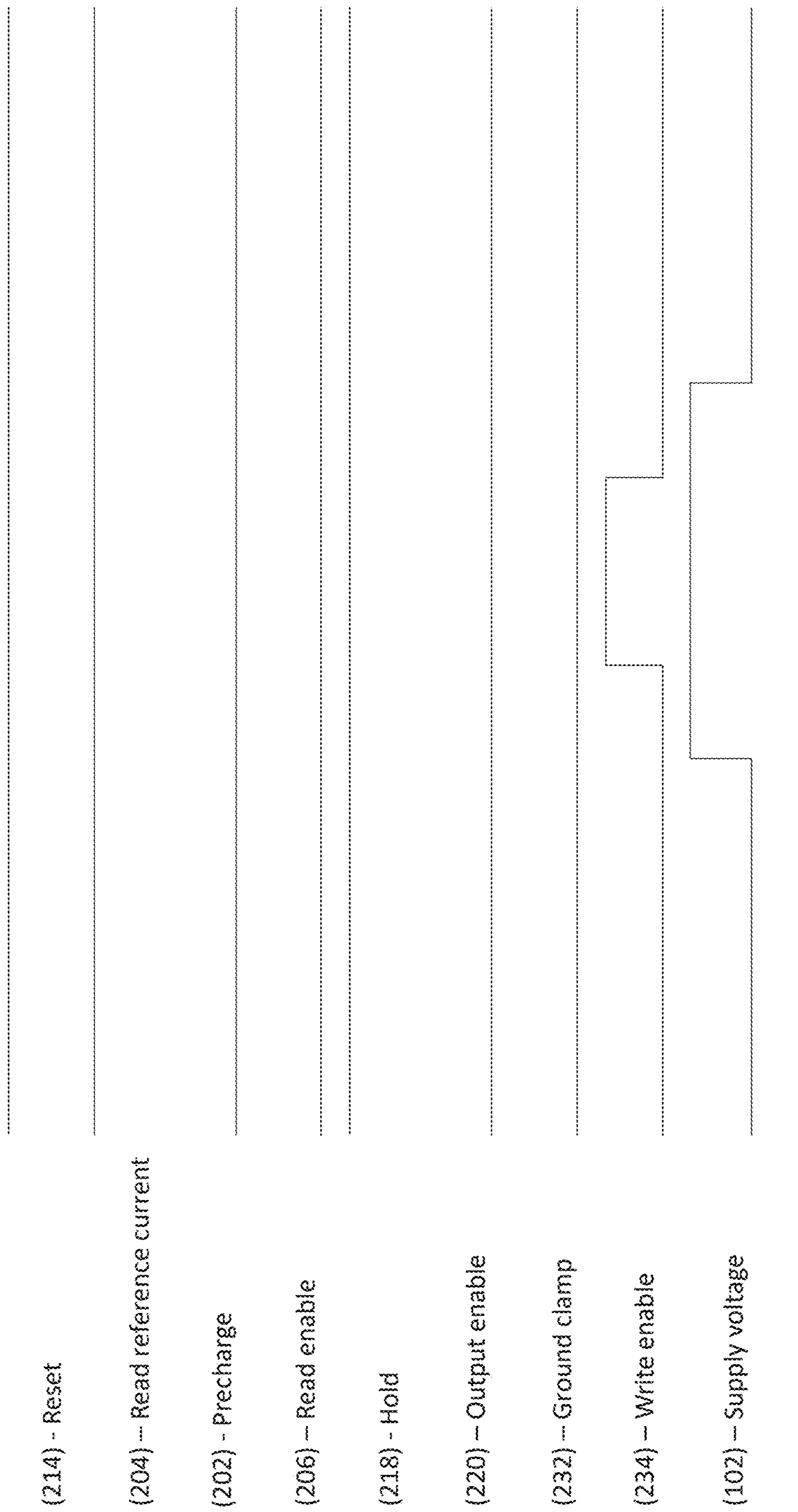
FIG. 7 is a timing diagram describing the signaling sequence for writing a single e-fuse bit, in accordance with embodiments of the present disclosure.

Now regarding FIG. 7, a timing diagram describing the signaling sequence for writing a single e-fuse bit 200, in accordance with embodiments of the present disclosure is depicted.

Now referring again to FIG. 7, the e-fuse circuit 200 is placed into programming (write) mode by setting reset 214 (active high in embodiments) to logic1, setting the read reference current 204 to logic1, setting precharge 202 (active low in embodiments) to logic0, setting read enable 206 (active high in embodiments) to logic0, setting latch clock (hold) 218 to logic1, setting output enable 220 (active high in embodiments) to logic0, and setting ground clamp 232 (active high in embodiments) to logic0. The previously described signal settings ensure that the circuitry used during read operations does not affect write operations.

Again referring to FIG. 7, a write operation to the e-fuse memory element 228 is preceded by enabling the supply voltage input 102. A pulse is then applied to write enable 234 (active high in embodiments) to control programming of the e-fuse memory element 228. When write enable 234 (active high in embodiments) is logic1, current flows from the supply voltage input 102 through the e-fuse memory element 228, and then through second n-channel MOSFET 226 to ground, thus programming the e-fuse memory element 228.

Figure 8:
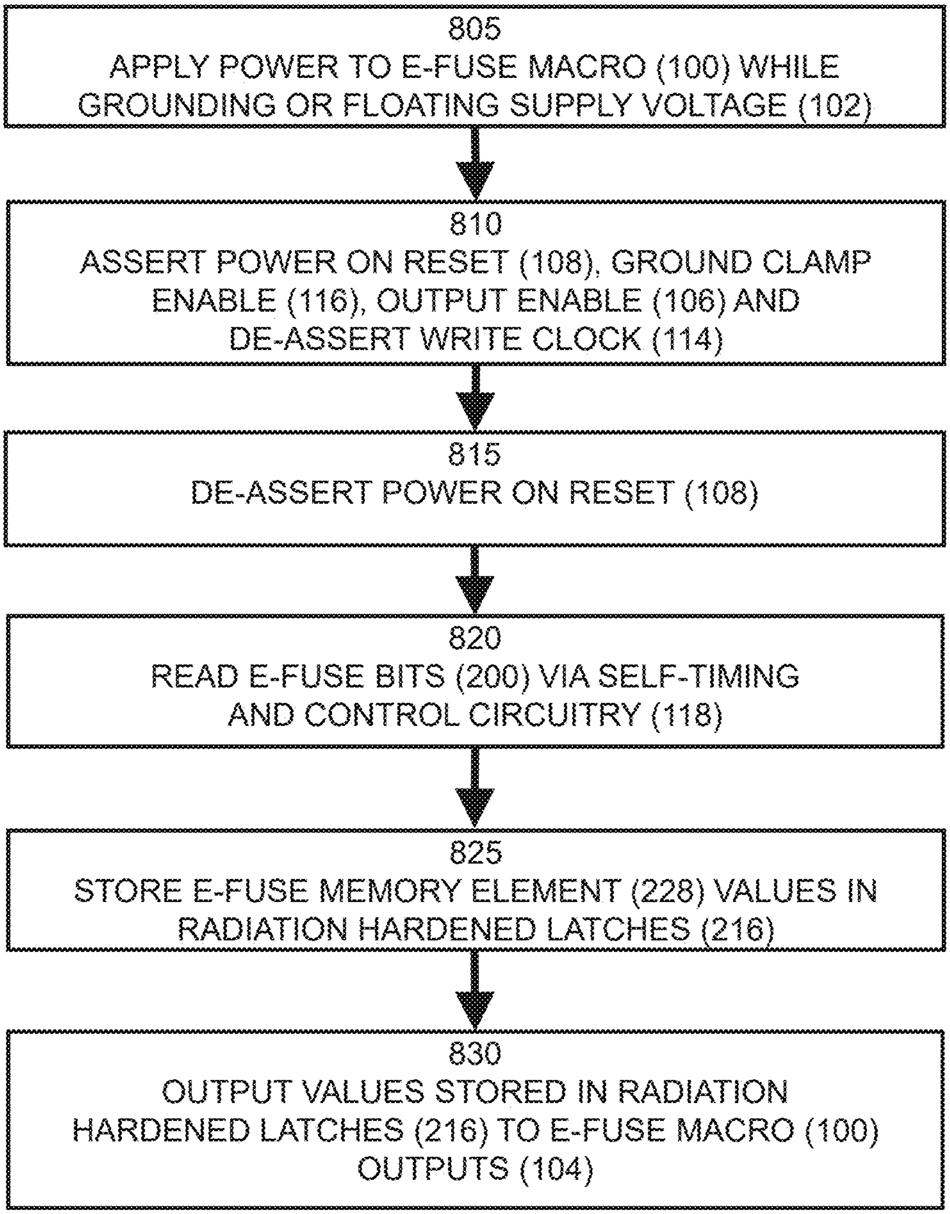
FIG. 8 is a flowchart describing the read method of FIG. 4, in accordance with embodiments of the present disclosure.

Now referring to FIG. 8, FIG. 8 provides a flowchart describing the read method of FIG. 4 800. More specifically, the method comprises: applying power to the e-fuse macro 100 while grounding or floating supply voltage 102-805; asserting power on reset 108, ground clamp enable 116, and input output enable 106 and de-asserting write clock 114-810; de-asserting power on reset 108-815; reading e-fuse bits 200 via self-timing and control circuitry 118-820; storing e-fuse memory element 228 values in radiation hardened latches 216-825; and outputting values stored in radiation hardened latches 216 to e-fuse macro 100 outputs 104-830.

Figure 9:
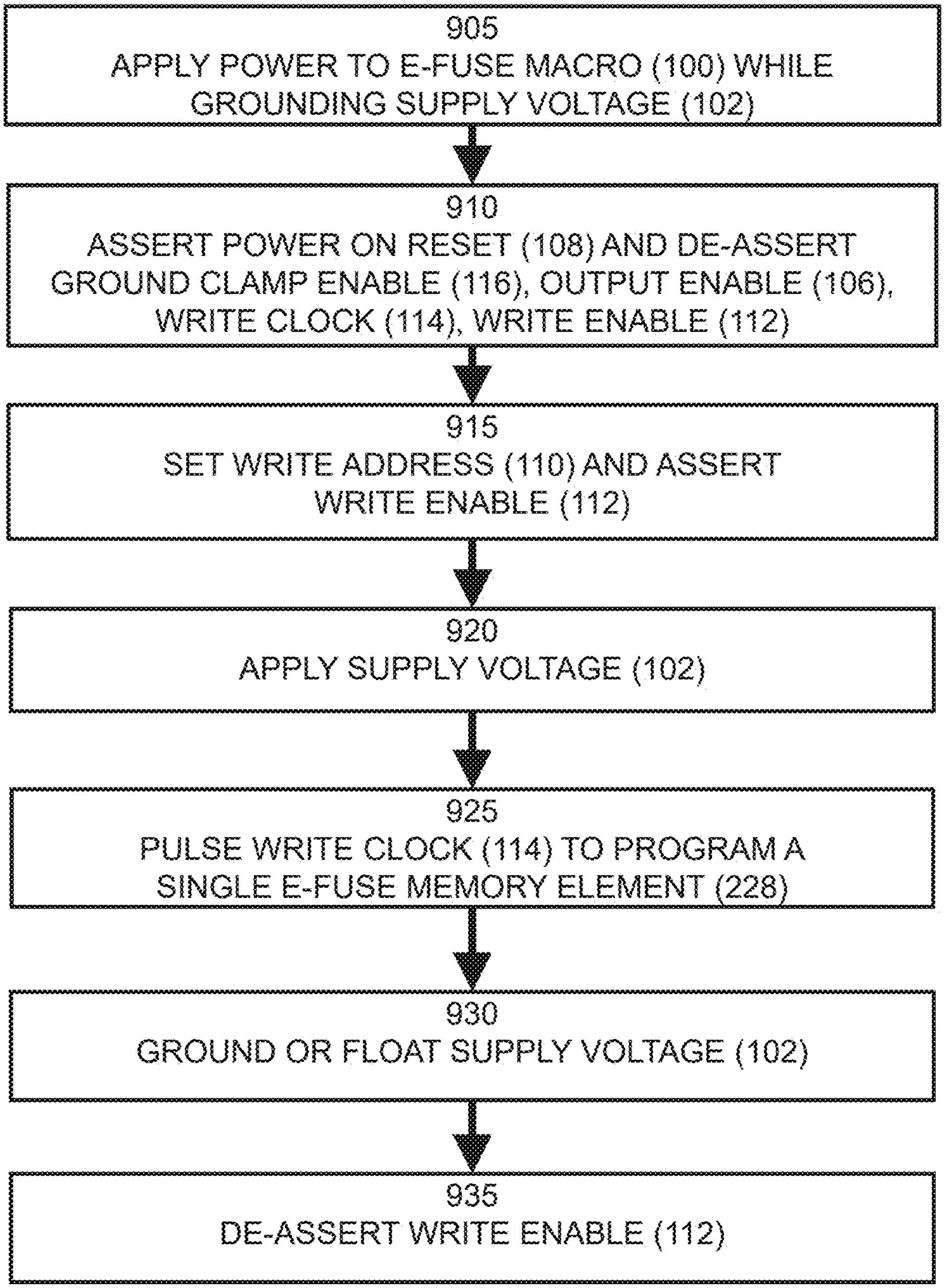
FIG. 9 is a flowchart describing the write method of FIG. 6, in accordance with embodiments of the present disclosure.

Now referring to FIG. 9, FIG. 9 provides a flowchart describing the write method of FIG. 6 900. More specifically, the method comprises: applying power to an e-fuse macro 100 while grounding or floating the supply voltage 102-905; asserting power on reset 108 and de-asserting ground clamp enable 116, input output enable 106, write clock 114, input write enable 112-910; set write address 110 and assert input write enable 112-915; apply supply voltage 102-920; pulsing write clock 114 to program a single e-fuse memory element 228-925; grounding or floating supply voltage 102-930; and de-asserting input write enable 112-935.

Figure 10:
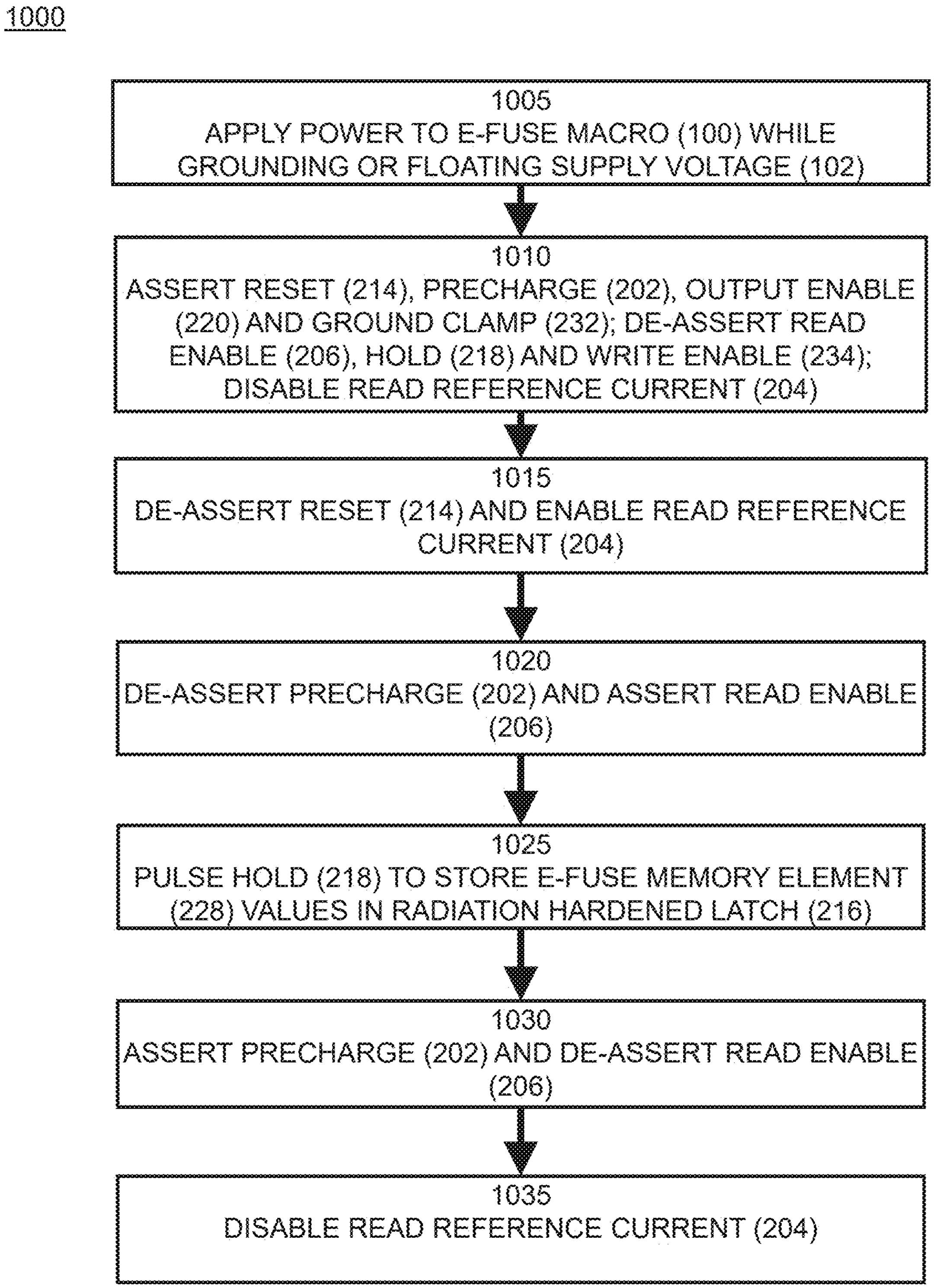
FIG. 10 is a flowchart describing the signaling sequence for reading a single e-fuse bit of FIG. 5, in accordance with embodiments of the present disclosure.

Now referring to FIG. 10, FIG. 10 provides a flowchart describing the signaling sequence for reading a single e-fuse bit of FIG. 5 1000. More specifically, the method comprises: applying power to the e-fuse macro 100 while grounding or floating supply voltage 102-1005; asserting reset 214, precharge 202, output enable 220, and ground clamp 232 as well as de-asserting read enable 206, hold 218, and write enable 234 as well as disabling read reference current 204-1010; de-asserting reset 214 and enabling read reference current 204-1015; de-asserting precharge 202 and asserting read enable 206-1020; pulsing hold 218, causing c-fusc memory element 228 values to be stored in radiation hardened latch 216-1025; asserting precharge 202 and de-asserting read enable 206-1030; and disabling rear reference current 204-1035.

Figure 11:
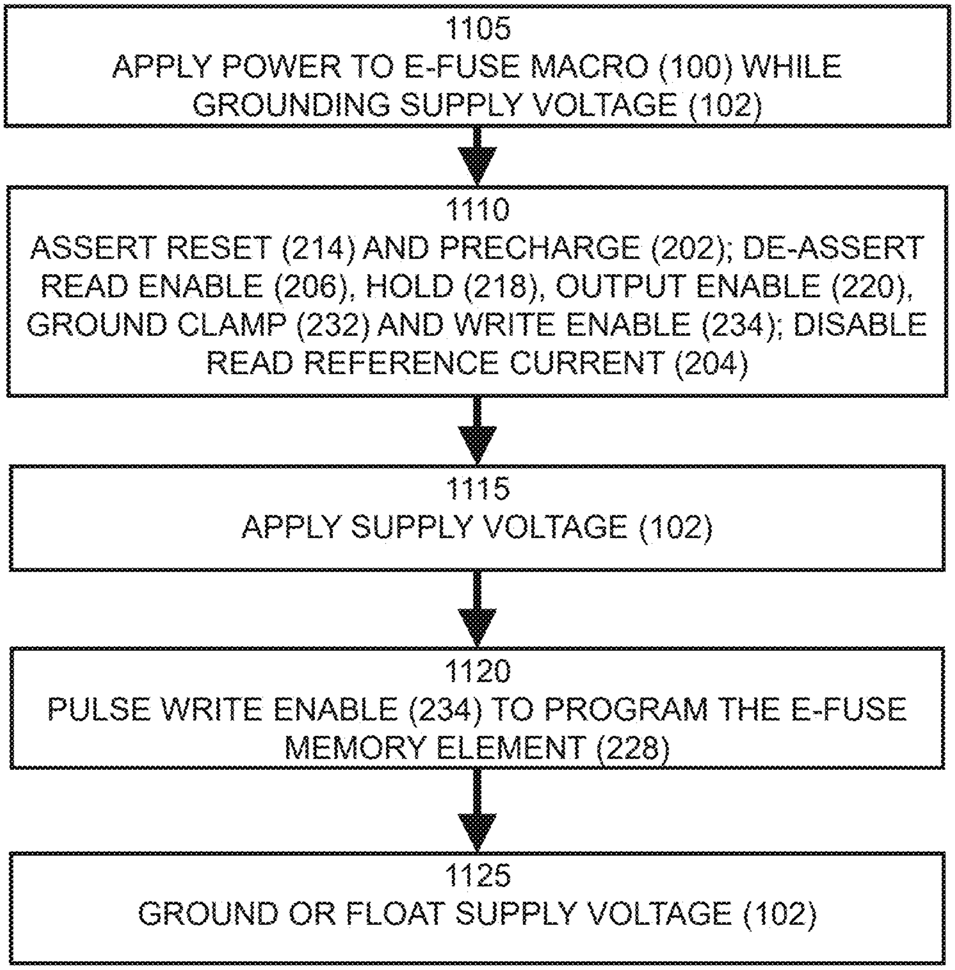
FIG. 11 is a is a flowchart describing the signaling sequence for writing a single e-fuse bit of FIG. 7, in accordance with embodiments of the present disclosure.

Now referring to FIG. 11, FIG. 11 provides a flowchart describing the signaling sequence for writing a single e-fuse bit of FIG. 7 1100. More specifically, the method comprises: applying power to an e-fuse macro 100 while grounding the supply voltage 102-1105; asserting reset 214 and precharge 202 and de-asserting read enable 206, hold 218, output enable 220, ground clamp 232, and write enable 234, while disabling read reference current 204-1110; Applying supply voltage 102-1115; pulsing write enable 234, thereby programming the e-fuse memory element 228-1120; and grounding or floating supply voltage 102-1125.

Now referring to the disclosure, generally, embodiments of the present disclosure are described throughout as comprising circuits and elements thereof that are described as being "active low", "active high", or similar. Such language is intended to describe the relationship between elements of embodiments and not to limit the disclosure to such embodiments, specifically. For instance, the polarity of circuit elements of embodiments could be entirely flipped while maintaining the functionality described herein. For the avoidance of doubt, it is the relationship between the polarity of one circuit and/or circuit element to another that is important, not the specific polarity used herein to describe specific embodiments, as would be known to one of ordinary skill in the art.

Furthermore, alternative circuits could be used, in embodiments, to achieve the functions described herein without departing from the scope of the present disclosure.

Also, while embodiments of the present disclosure are ideally suited for applications such as Integrated Circuit (IC) memory repair, device identifiers, or crypto keys, the teachings of the present disclosure relating to asynchronous operation would also apply to other types of synchronous and asynchronous integrated circuits.

Lastly, active high, active low, logic0, and logic1 are relative terms used only to denote the polarity and required logic, respectively, between circuit elements. A person of ordinary skill in the art would be able to design such circuits using different polarities and logic levels without departing from the teachings of the present disclosure.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

What is claimed is:

1. A method of reading a multi-bit asynchronous e-fuse macro, the method comprising:

providing a write address for a plurality of e-fuse bits using a write address bus in operative communication with the plurality of e-fuse bits;

applying power from a supply voltage to the e-fuse macro, wherein the supply voltage is either grounded or floating;

performing signaling by a self-timing and control circuitry;

asserting a power on reset, a precharge, a ground clamp enable, and an output enable while de-asserting a write clock;

de-asserting the power on reset;

reading the e-fuse bits upon de-asserting the power on reset via the self-timing and control circuitry, producing an e-fuse memory element;

storing the e-fuse memory element in at least one latch; and outputting the e-fuse memory element stored in the at least one latch to a fuse output.

2. The method of claim 1, wherein the at least one latch is a radiation hardened latch.

3. The method of claim 1, wherein reading the e-fuse bits upon de-asserting the power on reset is done asynchronously.

4. The method of claim 1, wherein reading the e-fuse bits upon de-asserting the power on reset is done asynchronously without requiring a periodic clock signal.

5. The method of claim 1, wherein the write address bus is a variable width bus configured to provide a plurality of write address bits.

6. The method of claim 1, wherein the reading of the e-fuse bits are done simultaneously.

7. The method of claim 1, wherein the fuse output comprises a number of e-fuse bits that is equal to two raised to the power of X, where X represents the number of write address bits.

8. The method of claim 1, wherein all e-fuse macro functions are externally controlled.

9. A method of writing a multi-bit, asynchronous e-fuse macro, the method comprising:

providing a write address for a plurality of e-fuse bits with a write address bus in operative communication with a plurality of e-fuse bits;

performing signaling by a self-timing and control circuitry;

applying power from a supply voltage to the e-fuse macro while grounding the supply voltage;

asserting a power on reset while de-asserting a ground clamp enable, an input output enable, a write clock, and a write enable;

setting the write address and asserting the write enable;

applying the supply voltage to the e-fuse macro;

pulsing the write clock to program an e-fuse memory element;

grounding or floating the supply voltage; and de-asserting the write enable.

10. A computer program product including one or more non-transitory machine-readable mediums encoded with instructions that when executed by one or more processors cause a process to be carried out for reading or writing a multi-bit, asynchronous e-fuse macro, wherein the e-fuse macro is configured to support two operating modes, an application mode configured to allow reading from the e-fuse macro and a programming mode configured to allow writing to the e-fuse macro, the process comprising:

when in the application mode, the process comprises:

providing a write address for a plurality of e-fuse bits using a write address bus in operative communication with the plurality of e-fuse bits;

performing signaling by a self-timing and control circuitry;

applying power from a supply voltage to the e-fuse macro, wherein the supply voltage is either grounded or floating;

asserting a power on reset, a precharge, a ground clamp enable, and an output enable while de-asserting a write clock;

de-asserting the power on reset;

reading the e-fuse bits upon de-asserting the power on reset via the self-timing and control circuitry, producing e-fuse memory element;

storing the e-fuse memory element in at least one latch; and outputting the e-fuse memory element stored in the at least one latch to a fuse output;

when in the programming mode, the process comprises:

providing a write address for the plurality of e-fuse bits with a write address bus in operative communication with the plurality of e-fuse bits;

performing signaling by a self-timing and control circuitry;

applying power from a supply voltage to the e-fuse macro while grounding the supply voltage;

asserting a power on reset while de-asserting a ground clamp enable, an input output enable, a write clock, and a write enable;

setting the write address and asserting the write enable;

applying the supply voltage to the e-fuse macro;

pulsing the write clock to program an e-fuse memory element;

grounding or floating the supply voltage; and de-asserting the write enable.

11. The computer program product of claim 10 wherein the at least one latch comprises at least one radiation hardened latch.

12. The computer program product of claim 10 wherein reading e-fuse bits upon de-assertion of power on reset is done asynchronously.

13. The computer program product of claim 10, wherein the reading mode is established by either floating or grounding the supply voltage input, setting write clock to logic0, setting ground clamp enable to logic0, and setting input output enable to logic1.

14. The computer program product of claim 10, the writing mode is established by grounding the supply voltage, setting input output enable to logic0, setting power on reset to logic0, and setting ground clamp enable to logic1.

* * * * *